United States Patent
Jin et al.

(10) Patent No.: US 11,848,397 B1
(45) Date of Patent: Dec. 19, 2023

(54) METHOD FOR PREPARING SOLAR CELL AND SOLAR CELL, PHOTOVOLTAIC MODULE

(71) Applicant: ZHEJIANG JINKO SOLAR CO., LTD., Zhejiang (CN)

(72) Inventors: Jingsheng Jin, Zhejiang (CN); Bike Zhang, Zhejiang (CN); Xinyu Zhang, Zhejiang (CN)

(73) Assignee: ZHEJIANG JINKO SOLAR CO., LTD., Zhejiang (CN)

( * ) Notice: Subject to any disclaimer, the term of this patent is extended or adjusted under 35 U.S.C. 154(b) by 0 days.

(21) Appl. No.: 17/880,646

(22) Filed: Aug. 3, 2022

(30) Foreign Application Priority Data

Jun. 15, 2022 (CN) .......................... 202210674313.X

(51) Int. Cl.
*H01L 31/18* (2006.01)
*H01L 31/048* (2014.01)
(Continued)

(52) U.S. Cl.
CPC .......... *H01L 31/182* (2013.01); *H01L 31/048* (2013.01); *H01L 31/068* (2013.01); *H01L 31/1868* (2013.01); *H01L 31/02363* (2013.01)

(58) Field of Classification Search
CPC .. H01L 31/182; H01L 31/068; H01L 31/1868
See application file for complete search history.

(56) References Cited

U.S. PATENT DOCUMENTS 5,970,369 A * 10/1999 Hara .................. H01L 21/2026
  438/149
6,187,088 B1 * 2/2001 Okumura .......... H01L 21/02488
  117/10

(Continued)

FOREIGN PATENT DOCUMENTS

CN          101540346 A      9/2009
CN          101919058 A      12/2010
(Continued)

OTHER PUBLICATIONS

Zhejiang Jinko Solar Co., Ltd., CN First Office Action with English translation, CN202210674313.X, dated Aug. 5, 2022, 15pgs.
(Continued)

*Primary Examiner* — Sadie White

(57) ABSTRACT

The present application relates to the technical field of solar cells, and in particular, to a method for preparing a solar cell, the solar cell, and a photovoltaic module. The method for preparing the solar cell includes: providing a substrate; forming a doped amorphous silicon layer on the first side of the substrate; performing laser treatment N times on the doped amorphous silicon layer to form N doped polysilicon layers ranging from a first doped polysilicon layer to a Nth doped polysilicon layer stacked in a direction away from the substrate, where N>1, a power, a wavelength and a pulse irradiation number of a nth laser treatment are respectively smaller than a power, a wavelength and a pulse irradiation number of a $(n-1)_{th}$ laser treatment, where n≤N, and the first doped polysilicon layer is disposed closer to the substrate (Continued)

than the Nth doped polysilicon layer. The embodiments of the present application are conducive to simplify the process of forming the solar cell.

13 Claims, 4 Drawing Sheets

(51) Int. Cl.
*H01L 31/068* (2012.01)
*H01L 31/0236* (2006.01)

(56) References Cited

U.S. PATENT DOCUMENTS

| | | | | |
|---|---|---|---|---|
| 6,329,270 | B1* | 12/2001 | Voutsas | H01L 31/03685 438/96 |
| 6,372,039 | B1* | 4/2002 | Okumura | H01L 21/2026 117/10 |
| 6,800,541 | B2* | 10/2004 | Okumura | H01L 21/2026 257/74 |
| 2001/0051388 | A1* | 12/2001 | Shiozaki | H01L 31/075 438/57 |
| 2003/0148565 | A1 | 8/2003 | Yamanaka | |
| 2003/0183270 | A1* | 10/2003 | Falk | H01L 31/056 136/258 |
| 2008/0305619 | A1* | 12/2008 | Lemmi | H01L 21/02628 257/E21.115 |
| 2010/0024865 | A1* | 2/2010 | Shah | H01L 31/1872 204/298.23 |
| 2011/0089429 | A1* | 4/2011 | Prabhakar | H01L 21/02691 257/E21.104 |
| 2012/0171804 | A1* | 7/2012 | Moslehi | H01L 31/18 257/E31.13 |
| 2016/0343569 | A1 | 11/2016 | Mazzamuto | |
| 2017/0222085 | A1* | 8/2017 | Cheong | H01L 31/02167 |

FOREIGN PATENT DOCUMENTS

| | | |
|---|---|---|
| CN | 106030759 A | 10/2016 |
| CN | 107039536 A | 8/2017 |
| CN | 107275198 A | 10/2017 |
| CN | 109346549 A | 2/2019 |
| CN | 111725359 A | 9/2020 |
| CN | 112736164 A | 4/2021 |
| CN | 112885924 A | 6/2021 |
| CN | 113903833 A | 1/2022 |
| EP | 3185307 A1 | 6/2017 |
| JP | 2010177264 A | 8/2010 |

OTHER PUBLICATIONS

Zhejiang Jinko Solar Co., Ltd., CN Decision to Grant with English translation, CN202210674313.X, dated Aug. 16, 2022, 6pgs.
Zhejiang Jinko Solar Co., Ltd., Extended European Search Report, EP22188405.9, dated May 17, 2023, 10 pgs.

* cited by examiner

METHOD FOR PREPARING SOLAR CELL AND SOLAR CELL, PHOTOVOLTAIC MODULE

CROSS REFERENCE TO RELATED APPLICATIONS

This application claims priority to Chinese Patent Application No. CN202210674313.X, entitled "METHOD FOR PREPARING SOLAR CELL AND SOLAR CELL, PHOTOVOLTAIC MODULE" filed on Jun. 15, 2022, which is hereby incorporated by reference in its entirety.

TECHNICAL FIELD

Embodiments of the present application relate to the field of solar cells, and in particular to a method for preparing a solar cell, the solar cell and a photovoltaic module.

BACKGROUND

In order to improve photoelectric conversion performance of a solar cell, a passivation contact layer is usually prepared on a rear surface of the solar cell. The solar cell is passivated by the passivation contact layer, thereby reducing recombination inside or on a surface of a substrate of the solar cell. The passivation contact layer in the conventional art generally includes a doped polysilicon layer, which is doped with conductive ions to form an energy band bending on a surface of the substrate, thereby playing a field passivation effect on minority carriers.

However, it is relatively difficult to prepare the doped polysilicon layer in the conventional art, so that an overall process for preparing the solar cell is complicated.

SUMMARY

Embodiments of the present application provide a method for preparing a solar cell, the solar cell, and a photovoltaic module, which are at least conducive to simplifying the overall process for preparing the solar cell.

In one aspect of the present application, a method for preparing a solar cell is provided. The method for preparing the solar cell includes: providing a substrate, where the substrate has a first surface on a first side of the substrate and a second surface on a second side of the substrate; forming a doped amorphous silicon layer on the first side of the substrate; performing laser treatment N times on the doped amorphous silicon layer to form N doped polysilicon layers ranging from a first doped polysilicon layer to a Nth doped polysilicon layer stacked in a direction away from the substrate, where N is a positive integer and N>1, a power, a wavelength and a pulse irradiation number of a nth laser treatment are respectively smaller than a power, a wavelength and a pulse irradiation number of a (n−1)th laser treatment, and a grain size of the nth doped polysilicon layer is larger than a grain size of the (n−1)th doped polysilicon layer in the formed N doped polysilicon layers, where n is a positive integer and 1<n≤N, and the first doped polysilicon layer is disposed closer to the substrate than the Nth doped polysilicon layer.

In some embodiments, the doped amorphous silicon layer has a thickness ranging from 30 nm to 300 nm.

In some embodiments, a power of the laser treatment ranges from 150 mJ/cm$^2$ to 500 mJ/cm$^2$, a wavelength of the laser treatment ranges from 250 nm to 600 nm, and a pulse irradiation number of the laser treatment ranges from 1 to 300 times.

In some embodiments, the doped amorphous silicon layer has a crystalline volume fraction ranging from 10% to 100%.

In some embodiments, N is 2, forming two doped polysilicon layers includes: performing a first laser treatment on the doped amorphous silicon layer to form an initial first doped polysilicon layer; performing a second laser treatment on the initial first doped polysilicon layer, where a part of the initial first doped polysilicon layer on which the second laser treatment is performed is converted into a second doped polysilicon layer, a part other than the second doped polysilicon layer in the initial first doped polysilicon layer forms a first doped polysilicon layer; where, a power of the first laser treatment ranges from 450 mJ/cm$^2$ to 500 mJ/cm$^2$; a wavelength of the first laser treatment ranges from 520 nm to 600 nm, and a pulse irradiation number of the first laser treatment ranges from 250 to 300 times; a power of the second laser treatment ranges from 150 mJ/cm$^2$ to 450 mJ/cm$^2$, a wavelength of the second laser treatment ranges from 520 nm to 600 nm, and a pulse irradiation number of the second laser treatment ranges from 230 to 380 times.

In some embodiments, the first doped polysilicon layer has a thickness ranging from 100 nm to 300 nm; a second doped polysilicon layer has a thickness ranging from 80 nm to 180 nm.

In some embodiments, performing the second laser treatment on the initial first doped polysilicon layer includes: performing the second laser treatment on a preset region of the initial first doped polysilicon layer to form the second doped polysilicon layer in the preset region of the initial first doped polysilicon layer.

In some embodiments, the preset region is a metal electrode region, and performing the second laser treatment on the initial first doped polysilicon layer further includes: forming a first metal electrode, where the first metal electrode is electrically connected to the second doped polysilicon layer.

In some embodiments, a width of the second doped polysilicon layer is not less than a width of the first metal electrode.

In some embodiments, the laser treatment is performed by doping at least one element of a carbon element, a nitrogen element, a phosphorus element, or a boron element is doped into the doped amorphous silicon layer.

In some embodiments, before forming the doped amorphous silicon layer, the method further includes: forming a tunneling layer on the first surface of the substrate.

In a second aspect of the present application, a solar cell is further provided. The solar cell includes: a substrate; N doped polysilicon layers located on a side of a first surface of the substrate and disposed in a direction away from the substrate, where a grain size of a nth doped polysilicon layer is greater than a grain size of a n−1th doped polysilicon layer, where N>1, n≤N, and a first doped polysilicon layer is disposed toward the substrate.

In some embodiments, N is 2, the first doped polysilicon layer is disposed around a second doped polysilicon layer, and a top surface of the first doped polysilicon layer is flush with a top surface of the second doped polysilicon layer.

In some embodiments, the solar cell further includes a first metal electrode, where the first metal electrode is electrically connected to the second doped polysilicon layer.

In some embodiments, the doped polysilicon layer further includes: at least one element of a carbon element, a nitrogen element, a phosphorus element, or a boron element.

In some embodiments, the solar cell also includes: a tunneling layer located between the first surface of the substrate and the first doped polysilicon layer.

In a third aspect of the present application, a photovoltaic module is further provided. The photovoltaic module includes a cell string, where the cell string is formed by connecting a plurality of solar cells with each other, each of the plurality of solar cells being a solar cell according to any one of the above; a package layer, configured to cover a surface of the cell string; a cover plate, configured to cover a surface of the package layer facing away from the cell string.

BRIEF DESCRIPTION OF THE DRAWINGS

One or more embodiments are described as examples with reference to the corresponding figures in the accompanying drawings and the exemplary description does not constitute a limitation to the embodiments. Unless otherwise stated, the figures in the accompanying drawings do not constitute a proportion limitation.

DETAILED DESCRIPTION

Figure 1:
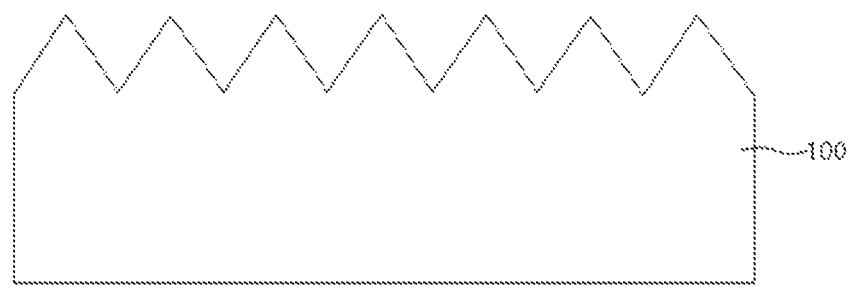
FIG. 1 is a schematic structural view corresponding to an operation of providing a substrate in a method for preparing a solar cell provided according to an embodiment of the present application.

It can be known from the background art that the current overall process for preparing the solar cell is complicated.

The analysis found that one of the reasons for the current overall process for preparing the solar cell being complicated is that: when a passivation contact layer is formed, multiple doped polysilicon layers with different degree of crystallization are generally formed, so as to realize property control for different doped polysilicon layers and cause the doped polysilicon layers with different degree of crystallization to play different roles, thereby synergistically improving the photoelectric conversion performance of the solar cell. In a process of forming multiple doped polysilicon layers with different degree of crystallization, it is necessary to form a first doped amorphous silicon layer first, and the first doped amorphous silicon layer is crystallized to form a first doped polysilicon layer. After that, a second doped amorphous silicon layer is formed, and the second doped amorphous silicon layer is crystallized to form a second doped polysilicon layer, and so on. In this way, operations of forming the multiple doped amorphous silicon layers are very complicated, which makes a process of preparing the solar cell relatively complicated.

Some embodiments of the present application provide a method for preparing a solar cell, including: forming a doped amorphous silicon layer on the first side of the substrate; performing laser treatment N times on the doped amorphous silicon layer to form N doped polysilicon layers ranging from a first doped polysilicon layer to a Nth doped polysilicon layer stacked in a direction away from the substrate, where N is a positive integer and N>1, a power, a wavelength and a pulse irradiation number of a nth laser treatment are respectively smaller than a power, a wavelength and a pulse irradiation number of a n−1th laser treatment. In this way, a depth of the nth laser treatment in the doped amorphous silicon layer is smaller than a depth of the n−1$_{th}$ laser treatment in the doped amorphous silicon layer, and a grain size of the nth doped polysilicon layer is larger than a grain size of the n−1th doped polysilicon layer in the formed N doped polysilicon layers. That is, the degree of crystallization of the nth doped polysilicon layer is greater than that of the n−1th doped polysilicon layer, thereby forming multiple doped polysilicon layers with different degree of crystallization. In the method for preparing the solar cell provided according to the embodiment of the present application, only one doped amorphous silicon layer needs to be formed, and multiple laser treatments are performed on the doped amorphous silicon layer to form the multiple doped polysilicon layers with different degree of crystallization, which greatly simplifies the process for preparing the solar cell.

The embodiments of the present application will be described in detail below with reference to the accompanying drawings. However, those of ordinary skill in the art can understand that, in various embodiment of the present application, many technical details are set forth in order to provide the reader with a better understanding of the present application. However, the technical solutions claimed in the present application may be realized even without these technical details and various changes and modifications based on the following embodiments.

FIG. 1 is a schematic structural view corresponding to an operation of providing a substrate in a method for preparing a solar cell provided according to an embodiment of the present application.

Referring to FIG. 1, a substrate 100 is provided.

The substrate 100 is configured to receive incident light and generate photo-generated carriers. In some embodiments, the solar cell is a double-sided cell, that is, both a first surface and a second surface of the substrate 100 are configured to receive sunlight. In some embodiments, the substrate 100 is a silicon substrate, and the silicon substrate may be made of any one of monocrystalline silicon, polycrystalline silicon, amorphous silicon, and microcrystalline silicon.

In some embodiments, the solar cell is a tunnel oxide passivated contact, TOPCON, cell, and both the first surface and the second surface of the substrate 100 are configured to receive incident light.

In some embodiments, the substrate 100 is an N-type semiconductor substrate, that is, the substrate 100 is doped with N-type ions. The N-type ions may be any one of phosphorus, arsenic, or antimony. The substrate 100 has the second surface opposite to the first surface, and the second surface of the substrate 100 has an emitter. The emitter is a P-type doped layer doped with P-type ions. The emitter and the substrate 100 together form a PN junction. In some embodiments, the emitter is obtained by doping a part of a surface of the substrate 100 with the P-type ions, and the part of the substrate 100 being doped is converted into the emitter. Specifically, in some embodiments, the P-type ions may be boron ions.

In some embodiments, the substrate 100 is double-textured. For example, a pyramid textured surface is prepared by wet chemical etching, and the first surface and the second surface of the substrate 100 are set as the pyramid textured surface. As a result, the first surface and the second surface of the substrate 100 have a small reflectivity to the incident light and a large absorption and utilization rate to the incident light, so that a photoelectric conversion efficiency of the solar cell is high. Specifically, in some embodiments, the substrate 100 is the N-type semiconductor substrate, and an alkaline solution, such as a NaOH solution, may be used for texturing. The corrosion of the NaOH solution is anisotropic, which is conducive to preparing a pyramid-like structure. In some embodiments, the pyramid-like structure may be a tetrahedron, an approximate tetrahedron, a pentahedron, an approximate pentahedron, or the like. It can be understood that, in other embodiments, chemical etching, laser etching, mechanical method, plasma etching and other methods may also be used to prepare the pyramid textured surface.

Figure 2:
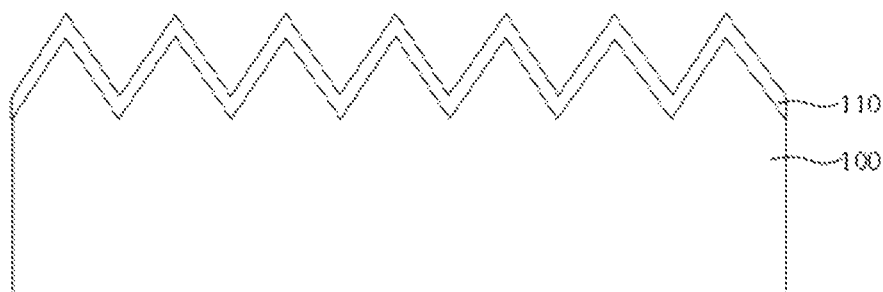
FIG. 2 is a schematic structural view corresponding to an operation of forming an emitter in a method for preparing a solar cell provided according to an embodiment of the present application.

FIG. 2 is a schematic structural view corresponding to an operation of forming an emitter in a method for preparing a solar cell according to an embodiment of the present application.

Referring to FIG. 2, an emitter 110 is formed. In some embodiments, the substrate 100 is the N-type semiconductor substrate, and the emitter 110 is a P-type emitter. Specifically, a specific process method for forming the emitter 110 is: performing boron diffusion treatment on the second surface of the substrate 100 to form the emitter 110, the emitter 110 and the N-type substrate 100 together form the PN junction. It is worth noting that after the emitter 110 is formed, borosilicate glass formed by the boron diffusion treatment needs to be removed. In this way, when a second passivation layer is subsequently formed on the emitter 110, the second passivation layer has a uniform thickness, which is conducive to improving an absorption ability of the second surface of the substrate 100 to the incident light. Specifically, a boron source used in the boron diffusion treatment includes liquid boron tribromide.

Figure 3:
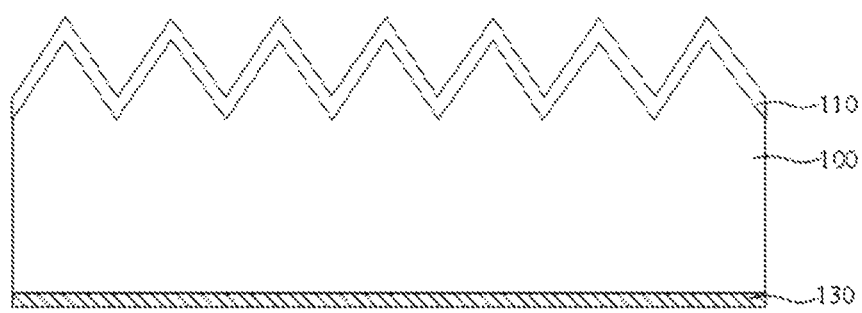
FIG. 3 is a schematic structural view corresponding to an operation of forming a tunneling layer in a method for preparing a solar cell provided according to an embodiment of the present application.
Figure 4:
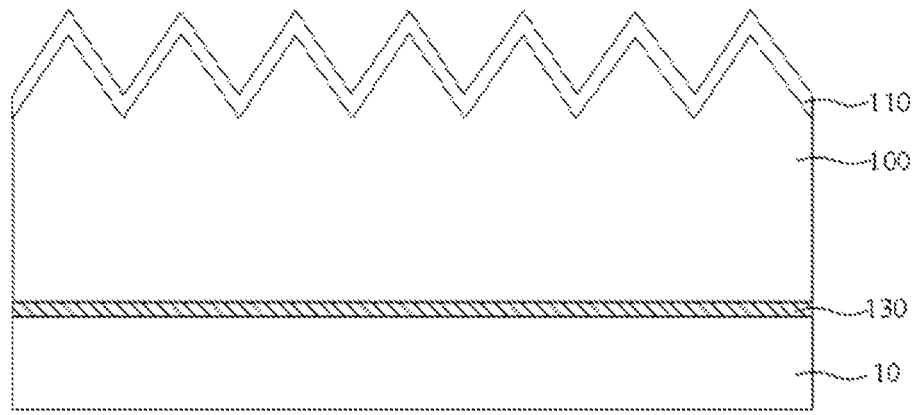
FIG. 4 is a schematic structural view corresponding to an operation of forming a doped amorphous silicon layer in a method for preparing a solar cell provided according to an embodiment of the present application.
Figure 5:
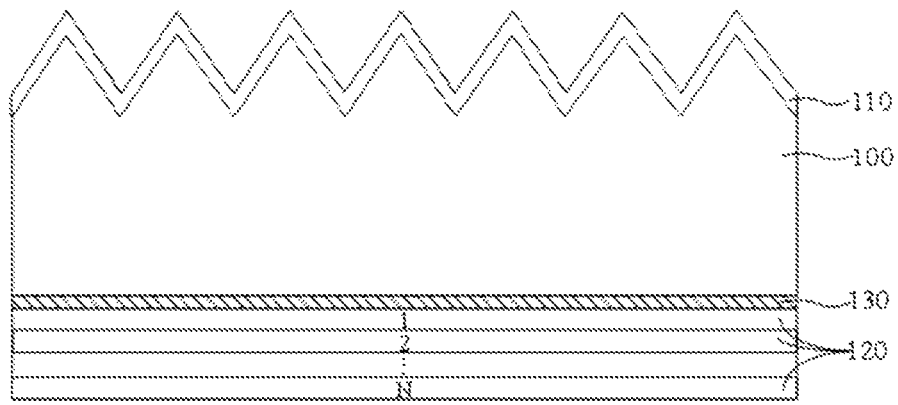
FIG. 5 is a schematic structural view corresponding to an operation of forming multiple doped polysilicon layers in a method for preparing a solar cell provided according to an embodiment of the present application.

FIG. 3 is a schematic structural view corresponding to an operation of forming a tunneling layer in a method for preparing a solar cell provided according to an embodiment of the present application; FIG. 4 is a schematic structural view corresponding to an operation of forming a doped amorphous silicon layer in a method for preparing a solar cell provided according to an embodiment of the present application; FIG. 5 is a schematic structural view corresponding to an operation of forming multiple doped polysilicon layers in a method for preparing a solar cell provided according to an embodiment of the present application.

Referring to FIGS. 3 to 5, a doped amorphous silicon layer 10 is formed on a side of the first surface of the substrate 100. The deposited doped amorphous silicon layer 10 is used for subsequent laser treatment to form the doped polysilicon layer.

Referring to FIG. 3, in some embodiments, before an operation of forming the doped amorphous silicon layer 10, the method further includes: forming a tunneling layer 130 on the first surface of the substrate 100. The tunneling layer 130 forms a passivation contact layer together with the doped polysilicon layer. The tunneling layer 130 is configured to realize interface passivation of the first surface of the substrate 100, and achieve effect of chemical passivation. Specifically, the tunneling layer 130 is disposed on the first surface of the substrate 100, so that the tunneling layer 130 has the effect of chemical passivation on the first surface of the substrate 100. Specifically, an interface defect state density on the first surface of the substrate 100 is reduced by saturating a suspension bond on the surface of the substrate 100, thereby reducing recombination centers on the first surface of the substrate 100 to decrease a carrier recombination rate. The tunneling layer 130 may be made of a dielectric material, such as anyone of silicon oxide, magnesium fluoride, amorphous silicon, polysilicon, silicon carbide, silicon nitride, silicon oxynitride, aluminum oxide or titanium oxide.

In some embodiments, the tunneling layer 130 is formed by using a deposition process, such as a chemical vapor deposition process. In other embodiments, in response to the tunneling layer 130 being made of the silicon oxide, the tunneling layer 130 may also be formed by using an in-situ growth process. For example, a thermal oxidation process and nitric acid passivation may be used to generate the tunneling layer 130 in situ on the first surface of the substrate 100.

Referring to FIG. 4, the doped amorphous silicon layer 10 is formed on a surface of the tunneling layer 130 facing away from the substrate 100. In some embodiments, the doped amorphous silicon layer 10 has doping elements of the same conductivity type as the substrate 100, so that selective transport of majority carriers can be achieved. In response to the substrate 100 being the N-type semiconductor substrate, the doping ions of the doped amorphous silicon layer 10 are N-type doping ions, for example, any one of phosphorus, arsenic, or antimony. In response to the substrate 100 being a P-type semiconductor substrate, the doping ions of the doped amorphous silicon layer 10 are P-type doping ions, such as boron ions.

In some embodiments, a method for forming the doped amorphous silicon layer 10 is as follows: depositing an amorphous silicon layer firstly on the surface of the tunneling layer 130. For example, the amorphous silicon layer is formed by plasma chemical vapor deposition and processed by a doping process to make the amorphous silicon layer doped with P-type or N-type ions, so that the amorphous silicon layer is converted into the doped amorphous silicon layer 10. Specifically, the amorphous silicon layer may be doped by either ion implantation or thermal diffusion. It can be understood that, in some embodiments, only the amorphous silicon layer is formed, and the amorphous silicon layer is directly subjected to the laser treatment to convert the amorphous silicon layer into a polysilicon layer. After that, the polysilicon layer is doped by the doping process to form the doped polysilicon layer.

In some embodiments, the doped amorphous silicon layer 10 has a thickness ranging from 30 nm to 300 nm, for example, 30 nm to 60 nm, 60 nm to 100 nm, 100 nm to 150 nm, 150 nm to 200 nm, 200 nm to 250 nm, or 250 nm to 300 nm. It can be understood that, in embodiments of the present application, the formed doped amorphous silicon layer 10 is configured to be a basis for subsequent formation of the multiple doped polysilicon layers. Therefore, the thickness of the doped amorphous silicon layer 10 is set within the above range, so that the thickness of the formed doped amorphous silicon layer 10 is not undersize, thereby providing more space for the subsequent formation of the multiple doped polysilicon layers. In addition, within the above range, the thickness of the doped amorphous silicon layer 10 is not excessive, so that an overall thickness of the doped polysilicon layer formed subsequently is not excessive, which is conducive to realizing miniaturization of the solar cell. Specifically, the thickness of the doped polysilicon layer is preset, and the thickness of the doped amorphous silicon layer 10 to be formed is set based on the thickness of the doped polysilicon layer. In this way, the thickness of the doped polysilicon layer formed based on the doped amorphous silicon layer is in line with forecast.

Referring to FIG. 4 and FIG. 5, the doped amorphous silicon layer 10 is subjected to laser treatments N times to form N doped polysilicon layers 120 in a direction away from the first surface of the substrate 100. Herein, N>1, and a power, a wavelength and a pulse irradiation number of a nth laser treatment are all smaller than a power, a wavelength, and a pulse irradiation number of the n−1th laser treatment. A grain size of a nth doped polysilicon layer 120 is greater than that of a n−1th doped polysilicon layer 120 in the formed N doped polysilicon layers 120, where n≤N, and a first doped polysilicon layer is disposed toward the substrate 100.

Since the power, the wavelength and the pulse irradiation number of the nth laser treatment are all smaller than the power, the wavelength, and the pulse irradiation number of the n−1th laser treatment, a depth of the nth laser treatment reaching the doped amorphous silicon layer 10 is smaller than a depth of the n−1th laser treatment reaching the doped amorphous silicon layer 10. It can be seen that, for multiple doped amorphous silicon layers 10, the closer to the substrate 100 to the substrate 100 is, the more the crystallization times is. The more the crystallization times, the greater the grain size of the formed doped amorphous silicon layer 10, that is, the higher the degree of crystallization. As a result, the multiple doped polysilicon layers 120 with different degree of crystallization are formed. Specifically, the doped amorphous silicon layer 10 that is subjected to one laser treatment forms a first doped polysilicon layer, and the doped amorphous silicon layer 10 that is subjected to two laser treatments forms a second doped polysilicon layer, and the doped amorphous silicon layer 10 that is subjected to laser treatments n times forms an nth doped polysilicon layer.

It can be seen from the above analysis that in the method for preparing the solar cell according to embodiments of the present application, only one doped amorphous silicon layer 10 needs to be formed. One doped polysilicon layer 120 is formed after each laser treatment for the doped amorphous silicon layer 10, and the formation of the multiple doped polysilicon layers 120 only requires multiple laser treatments on the doped amorphous silicon layer 10. The method for preparing the solar cell is simple, facilitates mass production, and thus can improve production capacity. In addition, the doped polysilicon layers 120 with different degree of crystallization are formed, to realize property control for different doped polysilicon layers and then make different doped polysilicon layers play different roles, thereby synergistically improving the photoelectric conversion performance of the solar cell.

In some embodiments, the laser treatment is laser heating treatment, and a principle of the laser heating treatment for crystallization of the doped amorphous silicon layer 10 is as follows: the high energy generated by the instantaneous laser pulse is irradiated into the doped amorphous silicon, so that thermal effect is produced on the surface of the doped amorphous silicon, which makes the doped amorphous silicon reach a very high temperature instantly, so as to realize the conversion from amorphous silicon to polycrystalline silicon. A laser used in the laser heating treatment may be any one of infrared laser, green laser, and ultraviolet laser, and a laser device used in the laser heating treatment may be any one of $CO_2$ laser device, excimer laser device, titanium sapphire laser device, and semiconductor laser device, which will not be specifically limited hereto in this embodiment.

In some embodiments, the power of the laser treatment may range from 150 $mJ/cm^2$ to 500 $mJ/cm^2$, for example, 150 $mJ/cm^2$ to 200 $mJ/cm^2$, 200 $mJ/cm^2$ to 250 $mJ/cm^2$, 250 $mJ/cm^2$ to 300 $mJ/cm^2$, 300 $mJ/cm^2$ to 350 $mJ/cm^2$, 350 $mJ/cm^2$ to 400 $mJ/cm^2$, 400 $mJ/cm^2$ to 450 $mJ/cm^2$ or 450 $mJ/cm^2$ to 500 $mJ/cm^2$. The wavelength of the laser treatment may range from 250 nm to 600 nm, for example, 250 nm to 300 nm, 300 nm to 350 nm, 350 nm to 400 nm, 400 nm to 450 nm, 450 nm to 500 nm, 500 nm to 550 nm or 550 nm to 600 nm. The pulse irradiation number of the laser treatment may range from 1 to 300 times, for example, 1 to 50 times, 50 to 100 times, 100 to 150 times, 150 to 200 times, 200 to 250 times, or 250 to 300 times. The power, the wavelength, and the pulsed irradiation number of the laser treatment can affect the depth of laser reaching the doped amorphous silicon layer 10 and the degree of crystallization. The power, the wavelength, and the pulse irradiation number of the laser treatment are set within the above ranges to ensure that a heat of the laser used in the laser heating treatment is high enough to produce thermal energy effect on the surface of the doped amorphous silicon layer 10, and realize the conversion from amorphous silicon to polycrystalline silicon. In addition, within the above ranges, the power of the laser treatment is not too high, to prevent damage of the surface of the doped amorphous silicon layer 10 caused by an excessive power of the laser treatment. In addition, a problem of excessively large grain size of the doped polysilicon layer 120 after multiple laser treatment due to the excessive power of the laser treatment can also be prevented, thereby preventing the formed doped polysilicon layer 120 from having excessively light absorption ability.

It is worth noting that a power range, a wavelength range, and a pulse irradiation number range of the laser treatment referred herein are the power range, the wavelength range, and the pulse irradiation number range of each of the laser treatments. That is, no matter how many times the laser treatment is performed, the power range, the wavelength range, and the pulse irradiation number range of each of the laser treatments are all within the above numerical ranges.

In some embodiments, the doped amorphous silicon layer 10 has a crystalline volume fraction ranging from 10% to 100%, for example, 10% to 20%, 20% to 40%, 40% to 55%, 55% to 70%, 70% to 85%, or 85% to 100%. The crystalline volume fraction refers to a volume ratio of crystallized doped amorphous silicon layer 10 to the entire doped amorphous silicon layer 10 in the doped amorphous silicon layer 10. The higher the crystalline volume fraction of the doped amorphous silicon layer 10 is, the higher the degree of crystallization of the doped amorphous silicon layer 10 is. Therefore, the crystalline volume fraction of the doped amorphous silicon layer 10 is set within the above ranges, to ensure that the doped amorphous silicon layer 10 is converted into the doped polysilicon layer 120.

Figure 6:
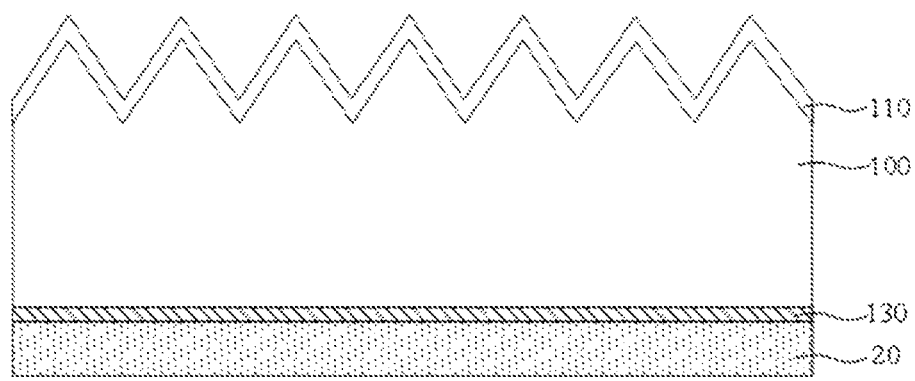
FIG. 6 is a schematic structural view corresponding to an operation of forming an initial first doped polysilicon layer in a method for preparing a solar cell provided according to an embodiment of the present application.

In some embodiments, N is 2, and the method for forming two doped polysilicon layers 120 includes: referring to FIG. 4 and FIG. 6, performing a first laser treatment on the doped amorphous silicon layer 10 to form an initial first doped polysilicon layer 20. The initial first doped polysilicon layer 20 is only subjected to one laser treatment, so the degree of crystallization is relatively low.

Next, a second laser treatment is performed on the initial first doped polysilicon layer 20, where a part of the initial first doped polysilicon layer 20 on which the second laser treatment is performed is converted into a second doped polysilicon layer, and a part other than the second doped polysilicon layer in the initial first doped polysilicon layer 20 forms a first doped polysilicon layer. A power, a wavelength, and a pulse irradiation number of the second laser treatment are all smaller than a power, a wavelength, and a pulse irradiation number of the first laser treatment. Therefore, the second laser treatment only processes the initial first doped polysilicon layer 20 at a partial depth, to re-crystallize the initial first doped polysilicon layer 20 at this part, so that the initial first doped polysilicon layer 20 has a high degree of crystallization after the second laser treatment. Based on this, the second doped polysilicon layer is formed, and a part of the initial first doped polysilicon layer 20 on which the second laser treatment is not performed is the first doped polysilicon layer, and the degree of crystallization of the second doped polysilicon layer is greater than that of the first doped polysilicon layer.

Specifically, the power of the first laser treatment may range from 450 mJ/cm$^2$ to 500 mJ/cm$^2$, for example, 450 mJ/cm$^2$ to 460 mJ/cm$^2$, 460 mJ/cm$^2$ to 470 mJ/cm$^2$, 470 mJ/cm$^2$ to 480 mJ/cm$^2$, 480 mJ/cm$^2$ to 490 mJ/cm$^2$ or 490 mJ/cm$^2$ to 500 mJ/cm$^2$, specifically 500 mJ/cm$^2$. The wavelength of the first laser treatment may range from 520 nm to 600 nm, for example, 520 nm to 540 nm, 540 nm to 550 nm, 550 nm to 565 nm, 565 nm to 580 nm or 580 nm to 600 nm, specifically, 550 nm. The pulse irradiation number of the first laser treatment may range from 250 to 300 times, for example, 250 to 260 times, 260 to 270 times, 270 to 280 times, 280 to 290 times, or 290 to 300 times, specifically 280 times. The power of the second laser treatment may range from 150 mJ/cm$^2$ to 450 mJ/cm$^2$, for example, 150 mJ/cm$^2$ to 200 mJ/cm$^2$, 200 mJ/cm$^2$ to 250 mJ/cm$^2$, 250 mJ/cm$^2$ to 300 mJ/cm$^2$, 300 mJ/cm$^2$ to 350 mJ/cm$^2$ or 350 mJ/cm$^2$ to 450 mJ/cm$^2$, specifically 250 mJ/cm$^2$. The wavelength of the second laser treatment may range from 520 to 600 nm, for example, 520 nm to 535 nm, 535 nm to 550 nm, 550 nm to 560 nm, 560 nm to 575 nm, 575 nm to 585 nm or 585 nm to 600 nm, specifically, 500 nm or 550 nm. The pulse irradiation number of the second laser treatment may range from 230 to 280 times, for example, 230 to 245 times, 245 to 260 times, 260 to 275 times, 275 to 290 times or 290 to 300 times, specifically 260 times. Within the above ranges, a difference between the degree of crystallization of the first doped polysilicon layer formed based on the first laser treatment and the degree of crystallization of the second doped polysilicon layer formed based on the second laser treatment is not excessive, so that a difference between the first doped polysilicon layer and the second doped polysilicon layer adjacent to each other in transmission capacities for the majority carriers is not excessive, which is conducive to maintaining good passivation effect of the first doped polysilicon layer and the second doped polysilicon layer. In addition, within the above ranges, the degree of crystallization of the formed second doped polysilicon layer is not excessive, to avoid the problem that the absorption capacity of the second doped polysilicon layer to the incident light is too strong due to the high degree of crystallization.

Based on the powers, the wavelengths, and the pulse irradiation numbers of the first laser treatment and the second laser treatment, a thickness of the formed first doped polysilicon layer may range from 100 nm to 300 nm, for example, 100 nm to 150 nm, 150 nm to 200 nm, 200 nm to 250 nm or 250 nm to 300 nm, specifically 200 nm. A thickness of the second doped polysilicon layer may range from 80 nm to 180 nm, for example, 80 nm to 100 nm, 100 nm to 120 nm, 120 nm to 145 nm, 145 nm to 160 nm, or 160 nm to 180 nm, specifically, 60% of the thickness of the first doped polysilicon layer. Within the above thickness ranges, the thicknesses of the first doped polysilicon layer and the second doped polysilicon layer are relatively large, so that when a metal electrode is subsequently formed on the first surface of the substrate 100, the metal electrode is unable to easily penetrate the first doped polysilicon layer and the second doped polysilicon layer, which is conducive to maintaining the integrity of the formed solar cell. In addition, within the above ranges, the thicknesses of the first doped polysilicon layer and the second doped polysilicon layer are not excessive, to avoid the problem that the absorption capacity of the first doped polysilicon layer and the second doped polysilicon layer to the incident light is too strong due to an excessive volume, so that more incident light can be absorbed by the substrate 100. In some embodiments, the thickness of the second doped polysilicon layer is set to be smaller than the thickness of the first doped polysilicon layer. That is, since the second doped polysilicon layer has a greater degree of crystallization, the second doped polysilicon layer has stronger absorption ability to the incident light, the absorption ability of the second doped polysilicon layer to the incident light is weakened by setting the thickness of the second doped polysilicon layer to be smaller. It can be understood that, in some embodiments, the thicknesses of the first doped polysilicon layer and the second doped polysilicon layer are preset, based on which the powers, the wavelengths, and the pulse irradiation numbers of the first laser treatment and the second laser treatment may be set.

Figure 7:
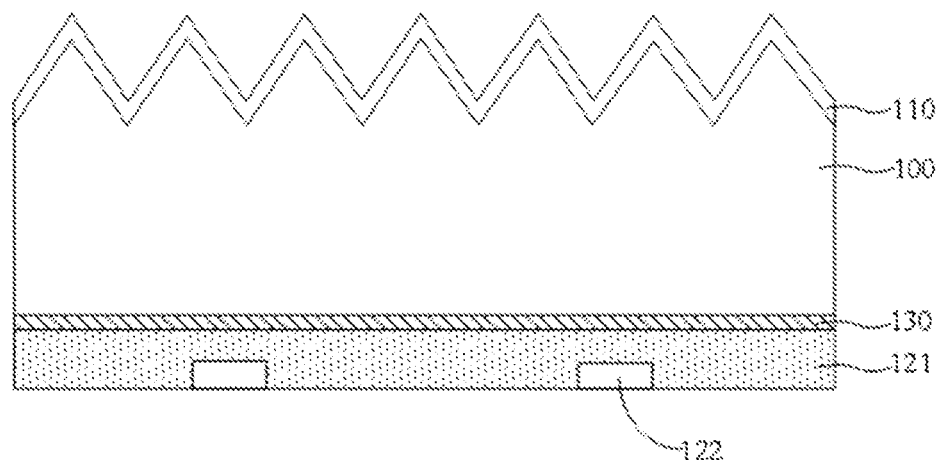
FIG. 7 is a schematic structural view corresponding to an operation of forming a second doped polysilicon layer in a method for preparing a solar cell provided according to an embodiment of the present application.

FIG. 6 is a schematic structural view corresponding to an operation of forming an initial first doped polysilicon layer in a method for preparing a solar cell provided according to an embodiment of the present application. FIG. 7 is a schematic structural view corresponding to an operation of forming a second doped polysilicon layer in a method for preparing a solar cell provided according to an embodiment of the present application.

Referring to FIG. 6 and FIG. 7, in some embodiments, performing the second laser treatment on the initial first layer doped polysilicon layer 20 includes: performing the second laser treatment on a preset region of the initial first layer doped polysilicon layer 20 to form a second doped polysilicon layer 122 in the preset region of the initial first doped polysilicon layer 20, and form the first doped polysilicon layer 121 in a part of the initial first doped polysilicon layer 20 on which the second laser treatment is not performed. That is, only part of the initial first doped polysilicon layer 20 is subjected to the second laser treatment, so that a volume of the formed second doped polysilicon layer 122 is relatively small. In this way, since the degree of crystallization of the first doped polysilicon layer 121 is smaller than that of the second doped polysilicon layer 122, the absorption ability of the second doped polysilicon layer 122 to the incident light is weakened by setting the volume of the second doped polysilicon layer 122 to be smaller, thereby increasing a total amount of incident light entering the substrate 100 and increasing a short-circuit current and an open-circuit voltage of the solar cell. Specifically, the first doped polysilicon layer 121 is disposed around the second doped polysilicon layer 122, and a top surface of the first doped polysilicon layer 121 is flush with a top surface of the second doped polysilicon layer 122.

Referring to FIGS. 4 to 7, in some embodiments, the doped amorphous silicon layer 1 may also be doped with at least one element of a carbon element, a nitrogen element, a phosphorus element or a boron element in the operation of performing the laser treatment. A band gap in the doped polysilicon layer 120 may be adjusted by doping the carbon element, oxygen element, phosphorus element or boron element into the doped amorphous silicon layer 10, to adjust the performance of the doped polysilicon layer 120, thereby further reducing the absorption ability of the doped polysilicon layer 120 to the incident light and achieving low optical absorption.

In some embodiments, in response to the doped amorphous silicon layer 10 being subjected to two laser treatment processes to form two doped polysilicon layers 120, the elements doped in the first laser treatment and the second laser treatment may be different. For example, the carbon element may be doped during the first laser treatment, the oxygen element may be doped during the second laser treatment, and two different elements may be combined to adjust the band gap of the doped polysilicon layer 120, to realize performance adjustment of the doped polysilicon layer 120 at different levels.

Specifically, in some embodiments, doping elements in the operation of performing the laser treatment includes: passing a reaction gas containing at least one element of the carbon element, the oxygen element, the phosphorus element, or the boron element into a reaction chamber. For example, when the oxygen element needs to be doped, oxygen is introduced, and the laser treatment is performed in an oxygen atmosphere. Under an action of laser thermal effect, the oxygen element in the oxygen is pushed into the doped amorphous silicon.

In other embodiments, doping elements in the operation of performing the laser treatment further includes: coating the surface of the doped amorphous silicon layer with a reaction solution containing at least one element of the carbon element, the oxygen element, the phosphorus element, or the boron element and performing the laser treatment. Under the action of the laser thermal effect, the doping elements in the reaction solution are pushed into the doped amorphous silicon layer.

Figure 8:
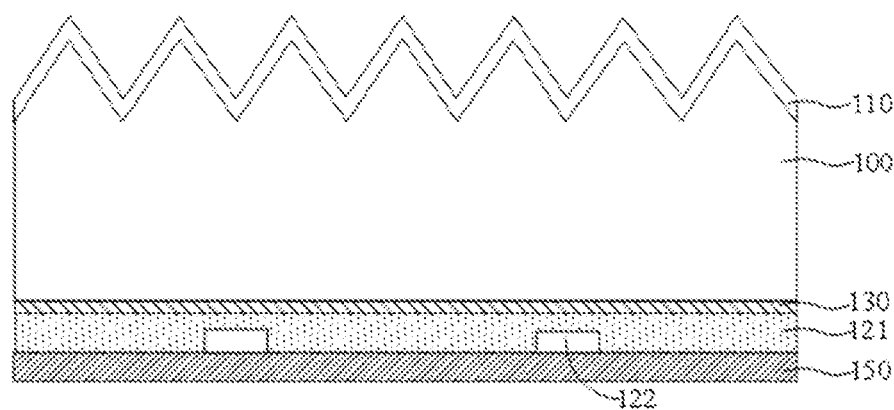
FIG. 8 is a schematic structural view corresponding to an operation of forming a first passivation layer in a method for preparing a solar cell provided according to an embodiment of the present application.
Figure 9:
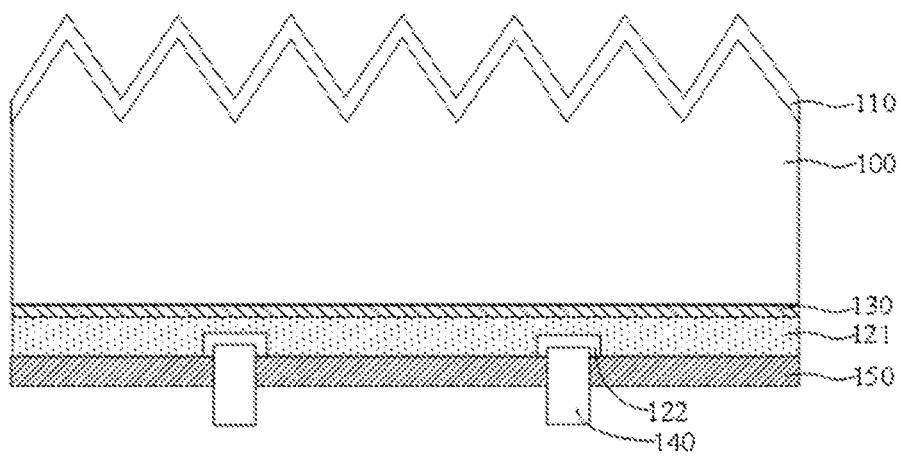
FIG. 9 is a schematic structural view corresponding to an operation of forming a first metal electrode in a method for preparing a solar cell provided according to an embodiment of the present application.

FIG. 8 is a schematic structural view corresponding to an operation of forming a first passivation layer in a method for preparing a solar cell provided according to an embodiment of the present application, and FIG. 9 is a schematic structural view corresponding to an operation of forming a first metal electrode in a method for preparing a solar cell provided according to an embodiment of the present application.

Referring to FIG. 8 and FIG. 9, in some embodiments, the preset region is a metal electrode region, and the method for preparing the solar cell further includes: forming a first metal electrode 140, where the first metal electrode 140 is electrically connected to the second doped polysilicon layer 122. Since the second doped polysilicon layer 122 has a high degree of crystallization, in response to the first metal electrode 140 being electrically connected to the second doped polysilicon layer 122, carrier recombination between the first metal electrode 140 and the second doped polysilicon layer is reduced. However, the degree of crystallization of the first doped polysilicon layer 121 is relatively low, so the absorption ability of the first doped polysilicon layer 121 to the incident light is weak, which enables more incident light to reach the substrate 100 through the first doped polysilicon layer 121, thereby improving the utilization rate of incident light, and achieving low optical absorption while improving passivation effect of a contact area of the first metal electrode 140.

In some embodiments, a width of the second doped polysilicon layer 122 is not less than a width of the first metal electrode 140. In this way, it can be ensured that the first metal electrode 140 is covered by the second doped polysilicon layer 122, so that both a side surface and a bottom surface of the first metal electrode 140 are in contact with the second doped polysilicon layer 122, thus further reducing carrier recombination between the electrode 140 and the second doped polysilicon layer 122 and improving the passivation effect. In addition, the width of the second doped polysilicon layer 122 is set to be larger, which is also conducive to increasing a process window for forming contact between the first metal electrode 140 and the second doped polysilicon layer 122.

Referring to FIG. 8, in some embodiments, before forming the first metal electrode 140, the method for preparing the solar cell further includes: forming a first passivation layer 150 on a surface of an outermost doped polysilicon layer facing away from the substrate 100. The first passivation layer 150 has desirable passivation effect, so that the carrier concentration on the surface of the substrate 100 is high, the carrier recombination is suppressed, the open-circuit voltage, the short-circuit current and a fill factor of the solar cell are improved, so as to improve a double-sided photoelectric conversion rate. In some embodiments, the first passivation layer 150 may be made of one or more of silicon oxide, aluminum oxide, silicon nitride, silicon oxynitride or silicon oxycarbonitride. Specifically, in some embodiments, the first passivation layer 150 may have a single-layer structure. In other embodiments, the first passivation layer 150 may also have a multi-layer structure. Specifically, in some embodiments, a plasma enhanced chemical vapor deposition (PECVD) method is used to form the first passivation layer 150.

Referring to FIG. 9, the first metal electrode 140 is formed after the first passivation layer 150 is formed, and forming the first metal electrode 140 includes: performing metallization treatment, including a screen printing process and a high-temperature sintering process, on a surface of the first passivation layer 150 on the first surface of the substrate 100 to form an electrical connection between the first metal electrode 140 and the second doped polysilicon layer 122. Specifically, the screen printing process is used to print and sinter metallization paste on the surface of the first passivation layer 150 corresponding to the second doped polysilicon layer 122 to form the first metal electrode 140.

Figure 10:
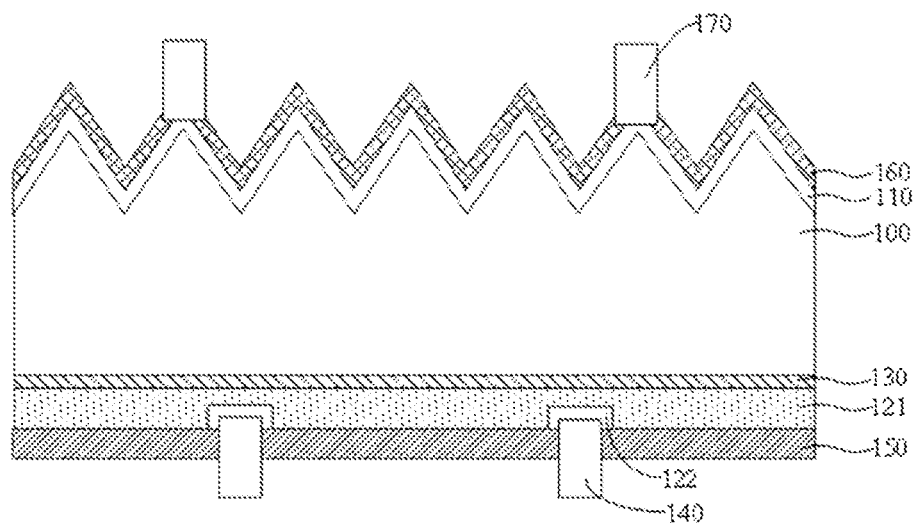
FIG. 10 is a schematic structural view corresponding to an operation of forming a second passivation layer and a second metal electrode in a method for preparing a solar cell provided according to an embodiment of the present application.

FIG. 10 is a schematic structural view corresponding to an operation of forming a second passivation layer and a second metal electrode in a method for preparing a solar cell according to an embodiment of the present application.

Referring to FIG. 10, in some embodiments, the method for preparing the solar cell further includes: forming a second passivation layer 160 on a surface of the emitter 110 facing away from the substrate 100. For example, the PECVD method may be used to form the second passivation layer 160 on the surface of the emitter 110 facing away from the substrate 100.

In some embodiments, the method for preparing the solar cell further includes: forming a second metal electrode 170, and the second metal electrode 170 penetrates through the second passivation layer 160 to be electrically connected to the emitter 110. In some embodiments, the screen printing process and the high temperature sintering process are used to form, on the second surface of the substrate 100, the second metal electrode 170 electrically connected to the emitter 110 on the second surface of the substrate 100.

The method for preparing the solar cell according to the above embodiments includes: forming the doped amorphous silicon layer 10 on a side of a first surface of the substrate 100; performing a laser treatment N time on the doped amorphous silicon layer 10 to form N doped polysilicon layers 120 in a direction away from the first surface of the substrate 100. A power, a wavelength and a pulse irradiation number of a nth laser treatment are all smaller than a power, a wavelength, and a pulse irradiation number of a n−1th laser treatment. In this way, a depth of the nth laser treatment in the doped amorphous silicon layer is smaller than a depth of the n−1th laser treatment in the doped amorphous silicon layer, and a grain size of the nth doped polysilicon layer 120 is greater than that of the n−1th doped polysilicon layer 120. That is, the degree of crystallization of the nth doped polysilicon layer 120 is greater than that of the n−1th doped polysilicon layer 120, thereby forming multiple doped polysilicon layers 120 with different degree of crystallization. That is, only one doped amorphous silicon layer 10 needs to be formed, and multiple laser treatments are performed on the doped amorphous silicon layer 10 to form the multiple doped polysilicon layers 120 with different degree of crystallization, which greatly simplifies the process for preparing the solar cell.

Accordingly, another embodiment of the present application further provides a solar cell, and the solar cell is prepared by using the method for preparing the solar cell according to the previous embodiments of the present application. The solar cell provided according to another embodiment of the present application will be described in detail below with reference to the accompanying drawings.

Figure 11:
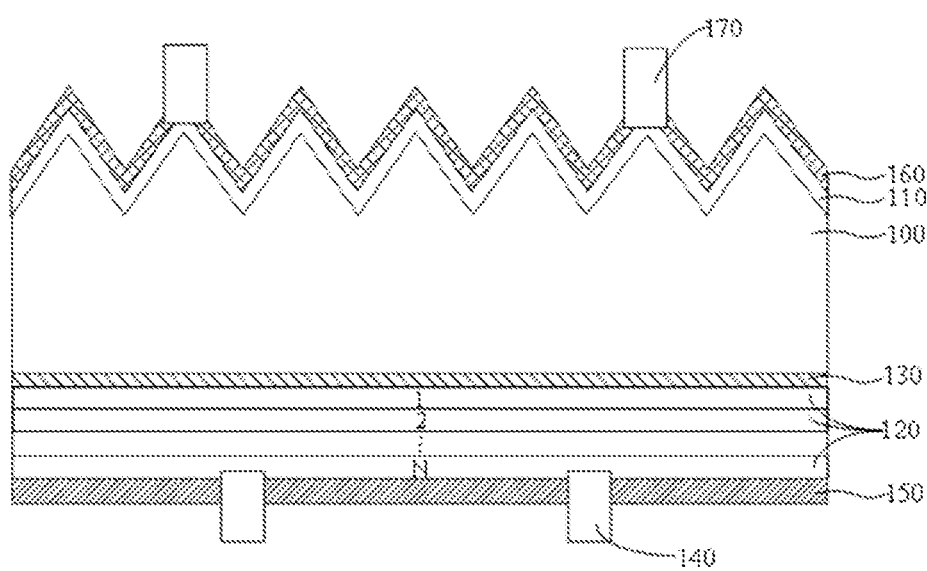
FIG. 11 is a schematic cross-sectional view of a solar cell provided according to another embodiment of the present application.

FIG. 11 is a schematic cross-sectional view of a solar cell provided according to another embodiment of the present application.

Referring to FIG. 11, the solar cell includes: a substrate 100; N doped polysilicon layers 120 located on a side of a first surface of the substrate 100 and disposed in a direction away from the substrate 100, where a grain size of a nth doped polysilicon layer 120 is greater than a grain size of a n−1th doped polysilicon layer 120, where N>1, n≤N, and a first doped polysilicon layer is disposed toward the substrate 100.

The substrate 100 is configured to receive incident light and generate photo-generated carriers. In some embodiments, the solar cell is a double-sided cell, that is, both a first surface and a second surface of the substrate 100 are configured to receive sunlight. In some embodiments, the substrate 100 is a silicon substrate, and the silicon substrate may be made of any one or combination of monocrystalline silicon, polycrystalline silicon, amorphous silicon, and microcrystalline silicon.

In some embodiments, the substrate 100 is an N-type semiconductor substrate. The substrate 100 has the second surface opposite to the first surface, and the second surface of the substrate 100 has an emitter 110. The emitter 110 may be a P-type doped layer, doped with P-type ions, and the emitter 110 and the substrate 100 together form a PN junction.

The doped polysilicon layers 120 are configured to form field passivation. That is, an electrostatic field that is directed to the inside of the substrate 100 is formed at an interface of the substrate 100, to make minority carriers escape from the interface and reduce a concentration of the minority carriers, so that a carrier recombination rate at the interface of the substrate 100 is low, thereby improving photoelectric conversion performance of the solar cell. In the N doped polysilicon layers 120, each of the N doped polysilicon layers 120 has a different degree of crystallization, and closer the doped polysilicon layer 120 to the substrate 100, the bigger the grain size of the doped polysilicon layer 120 is, so that different doped polysilicon layers 120 play different roles. In response to the doped polysilicon layer 120 with a higher degree of crystallization being in contact with a metal electrode, interface recombination between the doped polysilicon layer 120 and the metal electrode can be reduced, thus improving passivation effect. The doped polysilicon layer 120 with a lower degree of crystallization has a weaker optical absorption capacity, and thereby absorbing less incident light, so that more incident light can be absorbed by the substrate 100, thereby synergistically improving the photoelectric conversion performance of the solar cell.

In some embodiments, the doped polysilicon layers 120 have doping elements of the same conductivity type as the substrate 100. For example, in response to the substrate 100 being an N-type substrate, the doped polysilicon layers 120 includes N-type doping ions, such as anyone of phosphorus ions, arsenic ions or antimony ions.

Referring to FIG. 10, in some embodiments, N is 2, the first doped polysilicon layer 121 is disposed around the second doped polysilicon layer 122, and a top surface of the first doped polysilicon layer 121 is flush with a top surface of the second doped polysilicon layer 122. That is, the second doped polysilicon layer 122 exposes the top surface of the first doped polysilicon layer 121, that is, a volume of the second doped polysilicon layer 122 is smaller than that of the first doped polysilicon layer 121. In this way, a volume ratio of the second doped polysilicon layer 122 with a higher degree of crystallization is relatively small, to weaken the absorption ability of the second doped polysilicon layer 122 to incident light, and maintain a desirable passivation ability of the second doped polysilicon layer 122. In addition, a volume ratio of the first doped polysilicon layer 121 with a lower degree of crystallization is relatively high, so that the overall doped polysilicon layers 120 can achieve low optical absorption while improving the passivation effect.

In some embodiments, the solar cell further includes a first metal electrode 140, and the first metal electrode 140 is electrically connected to the second doped polysilicon layer 122. Since the second doped polysilicon layer 122 has a higher degree of crystallization than the first doped polysilicon layer 121, in response to the first metal electrode 140 being electrically connected to the second doped polysilicon layer 122, carrier recombination between the first metal electrode 140 and the second doped polysilicon layer 122 is reduced. However, the degree of crystallization of the first doped polysilicon layer 121 is relatively low, so the absorption ability of the first doped polysilicon layer 121 to the incident light is weak, which enables more incident light to reach the substrate 100 through the first doped polysilicon layer 121, thereby improving a utilization rate of incident light and achieve low optical absorption while improving the passivation effect of a contact area of the first metal electrode 140.

In some embodiments, a width of the second doped polysilicon layer 122 is not less than that of the first metal electrode 140, so that it can be ensured that the first metal electrode 140 can be covered by the second doped polysilicon layer 122, thereby further improving the interface recombination between the first metal electrode 140 and the second doped polysilicon layer 122.

In some embodiments, the doped polysilicon layer 120 further includes: at least one element of a carbon element, a nitrogen element, a phosphorus element, or a boron element. In this way, a band gap in the doped polysilicon layers 120 may be adjusted, to adjust the optical absorption performance of the doped polysilicon layers 120, reduce the absorption ability of the doped polysilicon layers 120 to incident light, and realize low optical absorption. Specifically, in some embodiments, in response to two doped polysilicon layers 120 being provided, the first doped polysilicon layer 121 is doped with the oxygen element, and the second doped polysilicon layer 122 is doped with the carbon element. That is, doping elements of the first doped polysilicon layer 121 and the second doped polysilicon layer 122 are different, and the band gap of the doped polysilicon layers 120 can be adjusted to achieve performance adjustment of the doped polysilicon layers 120 at different levels. It can be understood that, the doping elements of the first doped polysilicon layer 121 and the second doped polysilicon layer 122 may also be the same.

Referring to FIG. 10 and FIG. 11, in some embodiments, the solar cell further includes the tunneling layer 130, and the tunneling layer 130 is located between the first surface of the substrate 100 and the first doped polysilicon layer 121. The tunneling layer 130 is configured to form a passivation contact layer together with the doped polysilicon layer 120. The tunneling layer 130 is configured to realize interface passivation of the second surface of the substrate 100, and achieve chemical passivation effect. Specifically, the tunneling layer 130 is configured to reduce an interface defect state density of the first surface of the substrate 100, thereby reducing recombination centers of the first surface of the substrate 100 to reduce the carrier recombination rate. The tunneling layer 130 may be made of a dielectric material, such as anyone of silicon oxide, magnesium fluoride, amorphous silicon, polysilicon, silicon carbide, silicon nitride, silicon oxynitride, aluminum oxide, and titanium oxide.

In some embodiments, the solar cell further includes the first passivation layer 150. The first passivation layer 150 is located on a side of the outermost doped polysilicon layer away from the substrate 100, and the first metal electrode 140 penetrates the first passivation layer 150 and the tunneling layer 130 to be electrically connected to the second doped polysilicon layer 122. The first passivation layer 150 has a desirable passivation effect, so that a carrier concentration on the surface of the substrate 100 is high, the carrier recombination is suppressed, an open-circuit voltage, a short-circuit current and a fill factor of the solar cell are improved, to improve a double-sided photovoltaic conversion rate. In some embodiments, the first passivation layer 150 may be one or more of silicon oxide, aluminum oxide, silicon nitride, silicon oxynitride or silicon oxycarbonitride. Specifically, in some embodiments, the first passivation layer 150 may have a single-layer structure. In other embodiments, the first passivation layer 150 may have a multi-layer structure. Specifically, in some embodiments, the first passivation layer 150 is formed by using the PECVD method.

In some embodiments, the solar cell further includes: the second passivation layer 160 located on a surface of the emitter 110 facing away from the substrate 100. The second passivation layer 160 has an anti-reflection effect, so that more incident light can be irradiated to the surface of the substrate 100.

In some embodiments, the solar cell further includes the second metal electrode 170. The second metal electrode 170 penetrates the second passivation layer 160 to be electrically connected to the emitter 110.

In the solar cell according to the above embodiment, in the formed N doped polysilicon layers 120, each of the doped polysilicon layers 120 has a different degree of crystallization, and the closer the doped polysilicon layer 120 to the substrate 100, the bigger the grain size of the doped polysilicon layer 120 is, so that different doped polysilicon layers 120 play different roles. In response to the doped polysilicon layer 120 with a higher degree of crystallization being in contact with a metal electrode, interface recombination between the doped polysilicon layer 120 and the metal electrode can be reduced, thus improving passivation effect. The doped polysilicon layer 120 with a lower degree of crystallization has a weaker optical absorption capacity, and thereby absorbing less incident light, so that more incident light can be absorbed by the substrate 100, thereby synergistically improving the photoelectric conversion performance of the solar cell.

Figure 12:
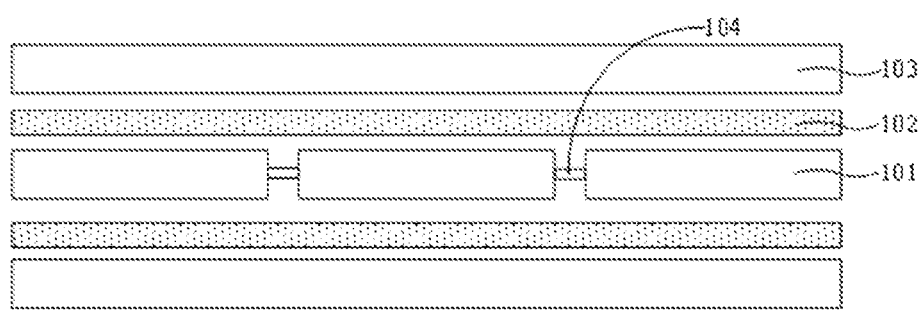
FIG. 12 is a schematic cross-sectional view of a photovoltaic module provided according to an embodiment of the present application.

Accordingly, some embodiments of the present application further provide a photovoltaic module. FIG. 12 is a schematic cross-sectional view of a photovoltaic module provided according to an embodiment of the present application. Referring to FIG. 12, the photovoltaic module includes a cell string, where the cell string is formed by connecting a plurality of solar cells with each other, each of the plurality of solar cells being the solar cell 101 provided according to the above embodiments or the solar cell 101 prepared by the method for preparing the solar cell 101 provided according the above embodiments; a package layer 102, configured to cover a surface of the cell string; a cover plate 103, configured to cover a surface of the package layer 102 facing away from the cell string. The solar cells 101 are electrically connected in a form of a whole piece or multiple pieces to form a plurality of cell strings, and the plurality of cell strings are electrically connected in series and/or parallel manner. Specifically, in some embodiments, the plurality of cell strings is electrically connected by a conductive strip 104. The package layer 102 covers a first surface and a second surface of the solar cell 101. Specifically, the package layer 102 may be an organic package film, such as an ethylene-vinyl acetate copolymer film, a polyethylene octene co-elastomer film or a polyethylene terephthalate film. In some embodiments, the cover plate 103 may be a cover plate with a light-transmitting function, such as a glass cover plate, a plastic cover plate, or the like. Specifically, a surface of the cover plate 103 facing the package layer 102 is a concave-convex surface with protrusions and recesses, thereby increasing a utilization rate of incident light.

Although the present application is disclosed above with preferred embodiments, the preferred embodiments are not used to limit the claims. Any person skilled in the art can make some possible changes and modifications without departing from the concept of the present application. Therefore, the protection scope of the present application should be subject to the scope defined by the claims of the present application.

Those of ordinary skill in the art can understand that the above embodiments are specific examples for realizing the present application, and in actual applications, various changes may be made in form and details without departing from the spirit and range of the present application. Any person skilled in the art can make their own changes and modifications without departing from the spirit and scope of the present application. Therefore, the protection scope of the present application should be subject to the scope defined by the claims.

The invention claimed is:

1. A method for preparing a solar cell, comprising:
    providing a substrate, wherein the substrate has a first surface on a first side of the substrate and a second surface on a second side of the substrate;
    forming a doped amorphous silicon layer on the first side of the substrate; and
    performing N laser treatments on the doped amorphous silicon layer to form N doped polysilicon layers ranging from a first doped polysilicon layer to a Nth doped polysilicon layer stacked in a direction away from the substrate, wherein N is a positive integer and N>1, a power, a wavelength and a pulse irradiation number of a nth laser treatment are respectively smaller than a power, a wavelength and a pulse irradiation number of a (n−1)th laser treatment, and a grain size of the nth doped polysilicon layer is larger than a grain size of the (n−1)th doped polysilicon layer in the formed N doped polysilicon layers, wherein n is a positive integer and 1<n≤N, and the first doped polysilicon layer is disposed closer to the substrate than the Nth doped polysilicon layer;
    wherein performing the N laser treatments includes doping at least one element of a carbon element, a nitrogen element, a phosphorus element, or a boron element into the doped amorphous silicon layer.

2. The method for preparing the solar cell according to claim 1, wherein the doped amorphous silicon layer has a thickness ranging from 30 nm to 300 nm.

3. The method for preparing the solar cell according to claim 1, wherein a power of each of the N laser treatments ranges from 150 mJ/cm2 to 500 mJ/cm2, a wavelength of each of the N laser treatments ranges from 250 nm to 600 nm, and a pulse irradiation number of each of the N laser treatments ranges from 1 to 300 times.

4. The method for preparing the solar cell according to claim 3, wherein the doped amorphous silicon layer has a crystalline volume fraction being larger than or equal to 10%, and smaller than 100%.

5. The method for preparing the solar cell according to claim 1, wherein in response to N being 2, forming two doped polysilicon layers comprises:
    performing a first laser treatment on the doped amorphous silicon layer to form an initial first doped polysilicon layer;
    performing a second laser treatment on the initial first doped polysilicon layer, wherein a part of the initial first doped polysilicon layer on which the second laser treatment is performed is converted into a second doped polysilicon layer, a part other than the second doped polysilicon layer in the initial first doped polysilicon layer forms a first doped polysilicon layer; wherein, a power of the first laser treatment ranges from 450 mJ/cm2 to 500 mJ/cm2; a wavelength of the first laser treatment ranges from 520 nm to 600 nm, and a pulse irradiation number of the first laser treatment ranges from 250 to 300 times; a power of the second laser treatment ranges from 150 mJ/cm2 to 450 mJ/cm2, a wavelength of the second laser treatment ranges from 520 nm to 600 nm, and a pulse irradiation number of the second laser treatment ranges from 230 to 380 times.

6. The method for preparing the solar cell according to claim 5, wherein the first doped polysilicon layer has a thickness ranging from 100 nm to 300 nm, and the second doped polysilicon layer has a thickness ranging from 80 nm to 180 nm.

7. The method for preparing the solar cell according to claim 5, wherein performing the second laser treatment on the initial first doped polysilicon layer comprises: performing the second laser treatment on a preset region of the initial first doped polysilicon layer to form the second doped polysilicon layer in the preset region of the initial first doped polysilicon layer.

8. The method for preparing the solar cell according to claim 7, wherein the preset region is a metal electrode region, and performing the second laser treatment on the initial first doped polysilicon layer further comprises: forming a first metal electrode, wherein the first metal electrode is electrically connected to the second doped polysilicon layer.

9. The method for preparing the solar cell according to claim 8, wherein before forming the first metal electrode, the method further comprises: forming a first passivation layer on a surface of an outermost doped polysilicon layer of the N doped polysilicon layers, facing away from the substrate.

10. The method for preparing the solar cell according to claim 8, wherein a width of the second doped polysilicon layer is not less than a width of the first metal electrode.

11. The method for preparing the solar cell according to claim 1, wherein before forming the doped amorphous silicon layer, the method further comprises: forming a tunneling layer on the first surface of the substrate.

12. The method for preparing the solar cell according to claim 1, further comprising: forming an emitter by performing boron diffusion treatment on the second surface of the substrate.

13. The method for preparing the solar cell according to claim 12, further comprising: forming another passivation layer on a surface of the emitter facing away from the substrate; and forming another metal electrode, wherein the second metal electrode penetrates through the second passivation layer to be electrically connected to the emitter.

* * * * *